United States Patent
Sawada et al.

(10) Patent No.: US 7,820,534 B2
(45) Date of Patent: Oct. 26, 2010

(54) METHOD OF MANUFACTURING SILICON CARBIDE SEMICONDUCTOR DEVICE

(75) Inventors: Takao Sawada, Tokyo (JP); Tomokatsu Watanabe, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 191 days.

(21) Appl. No.: 12/165,841

(22) Filed: Jul. 1, 2008

(65) Prior Publication Data

US 2009/0042375 A1 Feb. 12, 2009

(30) Foreign Application Priority Data

Aug. 10, 2007 (JP) ............... 2007-209282
Mar. 21, 2008 (JP) ............... 2008-073440

(51) Int. Cl.
*H01L 21/265* (2006.01)

(52) U.S. Cl. ............... 438/522; 438/758; 438/767; 438/771; 438/778; 257/77; 257/E21.051; 257/E21.055; 257/E21.065

(58) Field of Classification Search ............... 438/522, 438/758, 767, 771, 778; 257/77, E21.051, 257/E21.055, E21.065

See application file for complete search history.

(56) References Cited

U.S. PATENT DOCUMENTS 4,837,230 A * 6/1989 Chen et al. ............... 501/88
6,573,030 B1 6/2003 Fairbairn et al.
2005/0142361 A1 * 6/2005 Nakanishi et al. ............ 428/408
2006/0220027 A1 10/2006 Takahashi et al.
2007/0015373 A1 * 1/2007 Cowen et al. ............... 438/758

FOREIGN PATENT DOCUMENTS

| JP | 1-257198 | 10/1989 |
|---|---|---|
| JP | 2-84717 | 3/1990 |
| JP | 2002-194547 | 7/2002 |
| JP | 2005-353771 | 12/2005 |
| JP | 3760688 | 1/2006 |
| WO | WO 2005/076327 A1 | 8/2005 |

OTHER PUBLICATIONS

Guéret et al., "Methane Pyrolysis: Thermodynamics", Chemical Engineering Science, vol. 52, No. 5, pp. 85-827, 1997.*
Ziegler et al., "Pyrolysis of propane for CVI of pyrocarbon Part II. Experimental and modeling study of polyaromatic species", J. Anal Appl. Pyrolysis, 73, pp. 231-247, 2005.*
U.S. Appl. No. 12/267,040, filed Nov. 7, 2008, Watanabe, et al.

* cited by examiner

*Primary Examiner*—Charles D Garber
*Assistant Examiner*—Yasser A Abdelaziez
(74) *Attorney, Agent, or Firm*—Oblon, Spivak, McClelland, Maier & Neustadt, L.L.P.

(57) ABSTRACT

A method of manufacturing a silicon carbide semiconductor device includes ion-implanting an impurity in a surface of a silicon carbide wafer, and forming a carbon protection film of a predetermined thickness over all surfaces of the silicon carbide wafer, which has been ion-implanted with the impurity, by a chemical vapor deposition method that deposits a film by pyrolyzing a hydrocarbon gas. The method also includes annealing the silicon carbide wafer after the forming the carbon protection film.

19 Claims, 4 Drawing Sheets

METHOD OF MANUFACTURING SILICON CARBIDE SEMICONDUCTOR DEVICE

BACKGROUND OF THE INVENTION

1. Field of the Invention

The present invention relates to methods of manufacturing a silicon carbide semiconductor device.

2. Description of the Prior Art

Silicon carbide (SiC) allows for manufacturing a silicon carbide semiconductor device that has a higher breakdown voltage characteristic compared to using conventional silicon (Si), and has been expected as a material for a high power semiconductor device of the next generation. In manufacturing a silicon carbide semiconductor device from such silicon carbide, in order to control its conductivity-type and conductivity, an n-type or a p-type impurity is ion-implanted into a silicon carbide wafer that consists of silicon carbide layers formed by epitaxial crystal growth on a silicon carbide substrate. After the ion implantation, in order to activate the implanted ion and remove crystal defects having been created owing to the ion implantation, the silicon carbide wafer is processed by an annealing treatment in which the wafer is exposed to a hot atmosphere of an inert gas such as argon (Ar). Such annealing treatment of a silicon carbide wafer is preferably performed at a temperature as high as possible, in most cases at above 1500° C., desirably at above 1600° C., for stabilizing the characteristic thereof.

Annealing a silicon carbide wafer at such a high temperature, however, creates asperity called step bunching on the surface of the silicon carbide wafer. The reason for the creation of step bunching is as follows.

A silicon carbide wafer is typically obtained by forming silicon carbide layers by epitaxial crystal growth on a silicon carbide substrate. The epitaxial crystal growth is performed in such a way that the crystal axis is inclined approximately four or eight degrees with respect to the C-axis that is orthogonal to the (0001) crystal plane, in order to prevent crystals of, for example, the 6H- and 4H-types from mixedly growing on the same crystal surface.

When the silicon carbide wafer thus crystallized with its crystal axis being inclined is exposed to such a high temperature as in annealing treatments, silicon (Si) and carbon (C), which are the constituent elements thereof, evaporate from the surface of the silicon carbide wafer. In the evaporation, since silicon and carbon have different evaporating conditions and the crystal axis is inclined, the evaporation rates of silicon and carbon differ from each other in the surface of the silicon carbide wafer. As a result, step bunching is created on the silicon carbide wafer surface.

The step bunching thus created becomes an obstacle in forming a gate oxide film on the silicon carbide wafer having been annealed and further becomes an obstacle in forming a gate electrode on the gate oxide film. For example, there is a possibility of contactability reducing and of the leakage characteristic deteriorating due to asperity in the boundary surfaces between the silicon carbide wafer and the gate oxide film, or the gate oxide film and the gate electrode.

For that reason, to prevent or reduce step bunching has been a major problem for quality stability of silicon carbide semiconductor devices and for improvement in their manufacturing yields.

As for a method of preventing or reducing such step bunching, a technology has been disclosed in, for example, Patent Document 1 (Japanese Patent No. 3760688) in which a diamond-like carbon film or an organic film is formed on the surface of a silicon carbide wafer as a protection film that prevents evaporation of silicon and carbon during an annealing treatment.

Another technology has been disclosed in Patent Document 2 (Japanese Patent Application Publication No. 2005-353771) in which a carbon film is formed on an ion-implanted side of a silicon carbide wafer by a sputtering method as a protection film that prevents evaporation of silicon and carbon during an annealing treatment.

In the method of Patent Document 1, however, a carbonized resist is used as a protection film. A resist generally includes numbers of elements other than carbon and hydrogen for enhancing its optical activity and contactability. These elements other than carbon and hydrogen remain behind as contaminants in the protection film formed from the carbonized resist. For that reason, the contaminants evaporate or scatter during an annealing treatment, to be a source of contamination to the silicon carbide semiconductor device.

Moreover, in the method of Patent Document 2, while a carbon film formed by a sputtering method is used as a protection film, a sputtering method also sputters part of materials (for example, metal materials such as aluminum and stainless steel) that make up the sputtering apparatus. Accordingly, these sputtered materials scatter as contaminants, to be a source of contamination to the silicon carbide semiconductor device.

Furthermore, in the methods of Patent Documents 1 and 2, a protection film is formed on one surface of a silicon carbide wafer, to be more specific, on a side that is ion-implanted with an impurity, of the silicon carbide wafer. When a protection film is thus formed on only one surface of a silicon carbide wafer, unbalanced thermal stress is created in the silicon carbide wafer during an annealing treatment due to a temperature gradient produced therein and difference between the thermal expansion coefficients of the silicon carbide wafer and the protection film, which results in an increase of crystal defects in the silicon carbide wafer.

Such ingress of contaminants and increase of crystal defects are factors that contribute to unstable quality of silicon carbide semiconductor devices as well as reduction in manufacturing yields thereof.

SUMMARY OF THE INVENTION

The present invention is made to solve the above problems, and an object of the invention is to provide a method of forming on a silicon carbide wafer a protection film that is of extremely low contamination and causes no unbalanced thermal stress in the silicon carbide wafer for preventing creation of step bunching during an annealing treatment, and to thereby obtain a method of manufacturing a silicon carbide semiconductor device, which achieves improvements in its quality stability and manufacturing yields.

A method of manufacturing a silicon carbide semiconductor device, according to the present invention includes a step of ion-implanting an impurity into a surface of a silicon carbide wafer; a step of forming a carbon protection film of a predetermined thickness over the entire surface of the silicon carbide wafer having been ion-implanted with the impurity, by a chemical vapor deposition method that deposits a film by pyrolyzing a hydrocarbon gas; and a step of annealing the silicon carbide wafer having been formed with the carbon protection film.

According to the invention, a method of manufacturing a silicon carbide semiconductor device includes a step of forming a carbon protection film of a predetermined thickness over the entire surface of a silicon carbide wafer having been ion-implanted with an impurity, using a chemical vapor deposition method that deposits a film by pyrolyzing a hydrocarbon gas. Thereby, a carbon protection film of high purity and high quality can be obtained, which prevents the silicon carbide semiconductor device from being contaminated. Moreover, since unbalanced thermal stress created in the silicon carbide wafer can also be suppressed, crystal defects associated with the thermal stress, in the silicon carbide wafer are prevented from increasing. Therefore, the method of manufacturing a silicon carbide semiconductor device can be obtained that achieves improvements in its quality stability and manufacturing yields.

DETAILED DESCRIPTION OF THE PREFERRED EMBODIMENTS

Embodiment 1

A method of manufacturing a silicon carbide semiconductor device according to Embodiment 1 of the present invention will be described. Here, a method of manufacturing a power metal-oxide semiconductor field-effect transistor (power MOSFET) is explained as an example with reference to FIGS. 1 through 8.

Figure 1:
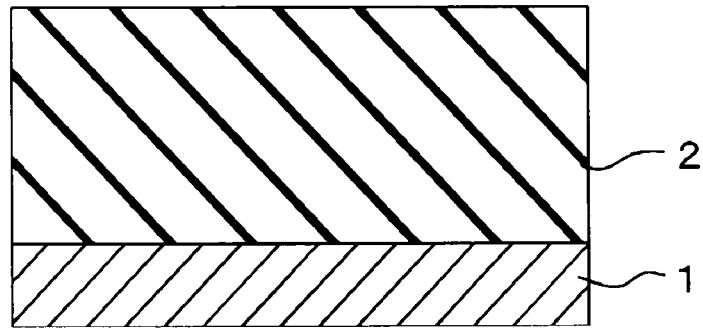
FIG. 1 is an illustration of one process in a method of manufacturing a silicon carbide semiconductor device, according to Embodiments 1 through 4 of the present invention.

Firstly, an $n^-$-type (a first conductivity-type) silicon carbide layer 2, which is made of silicon carbide, is formed on one surface of an $n^+$-type (a first conductivity-type) semiconductor substrate 1 by epitaxial crystal growth, as shown in FIG. 1. As the semiconductor substrate 1, for example, an $n^+$-type silicon carbide substrate is preferable. A silicon carbide wafer is made up of the semiconductor substrate 1 and the silicon carbide layer 2.

Figure 2:
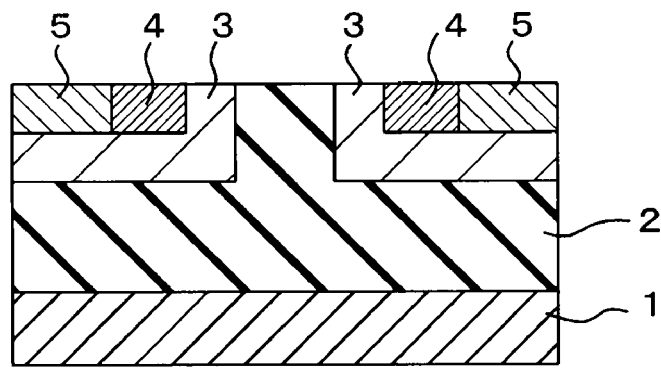
FIG. 2 is an illustration of one process in the method of manufacturing the silicon carbide semiconductor device, according to Embodiments 1 through 4 of the invention.

Next, a p-type (a second conductivity-type) well region 3 is formed by ion-implanting an impurity into a surface of the silicon carbide wafer using a resist as a mask for the well region. To be more specific, the impurity is ion-implanted selectively into a portion outside a predetermined radius, on the surface of the silicon carbide layer 2 constituting the silicon carbide wafer, as shown in FIG. 2. As an impurity to become a p-type in the silicon carbide layer 2, for example, boron (B) or aluminum (Al) is given. The resist is removed after the ion implantation.

Next, an n-type (a first conductivity-type) source region 4 is formed by ion-implanting an impurity selectively into the surface of the well region 3 using a resist as a mask for the source region, as shown in FIG. 2. As an impurity to become an n-type in the well region 3, for example, phosphorus (P) or nitrogen (N) is given. After the ion implantation, the resist is removed.

Next, a $p^+$-type (a second conductivity-type) contact region 5 is formed contiguous with the outer periphery of the source region 4 by ion-implanting a p-type (a second conductivity-type) impurity into the surface of the well region 3 using a resist as a mask for the contact region, as shown in FIG. 2. A concentration of the impurity in the contact region 5 is set here so as to be relatively higher than that in the well region 3. As an impurity to become a p-type in the well region 3, for example, boron (B) or aluminum (Al) is given. After the ion implantation, the resist is removed.

Figure 3:
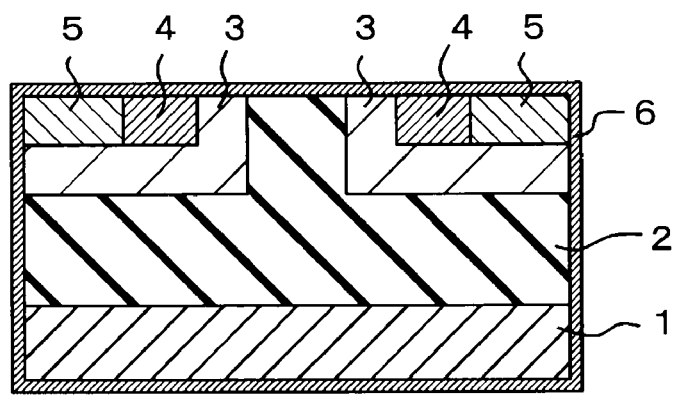
FIG. 3 is an illustration of one process in the method of manufacturing the silicon carbide semiconductor device, according to Embodiments 1 through 4 of the invention.

Next, a carbon protection film 6 is formed over the entire surface of the silicon carbide wafer by a chemical vapor deposition (CVD) method or the like using a hydrocarbon gas such as acetylene ($C_2H_2$), methane ($CH_4$), and propane ($C_3H_8$), as shown in FIG. 3. To be more specific, the inside of the deposition apparatus performing the CVD is heated to a temperature ranging from 900° C. to 1000° C. under atmospheric or reduced pressure while an inert gas such as argon (Ar) is being introduced as a carrier gas to flow into the deposition apparatus. The heating time is approximately twenty minutes. After that, the hydrocarbon gas of approximately 10% concentration is introduced into the flowing carrier gas, and then the hydrocarbon gas is pyrolyzed. Thereby, the carbon protection film 6 is formed to a predetermined thickness over the entire surface of the silicon carbide wafer. The predetermined thickness here is preferable to be from one nanometer, above which the effect of the protection film is brought about, to one thousand nanometers, under which cracks due to the thermal load imposing the silicon carbide wafer and to the temperature difference arising therein are not produced in the protection film. It is more preferable to be ten to five hundred nanometers, in which range the thickness is easy to control. Since a hydrocarbon gas of high purity can be thus used in a CVD method or the like, the carbon protection film 6 is formed to be of high quality and high purity with few contaminants. The high quality here implies an advanced state of graphitization. Moreover, since the carbon protection film 6 is formed over the entire surface of the silicon carbide wafer, the film formation can be performed in a batch operation. In other words, the film formation can be performed for a plurality of silicon carbide wafers all together by placing them within a deposition apparatus at intervals such that the carbon protection film 6 can be uniformly formed over the entire surface of each silicon carbide wafer, therefore improving throughput of the film formation.

Next, the silicon carbide wafer having been deposited with the carbon protection film 6 over the entire surface thereof is placed into an annealing apparatus, to be annealed in an inert gas atmosphere. To be more specific, in an argon atmosphere, the wafer, after being pre-heated at approximately 1000° C., is heated for a predetermined time (approximately thirty minutes) at a predetermined temperature (above 1500° C., preferably around 1700° C.), and then cooled immediately. Thereby, the implanted ion is electrically activated, and crystal defects created owing to the ion implantation are removed. After the annealing treatment, the carbon protection film 6 is removed by being exposed to an oxygen atmosphere at approximately 950° C. for about thirty minutes. Otherwise, the carbon protection film 6 can also be removed by ashing using oxygen plasma that is employed for resist removal. During the annealing treatment, since the silicon carbide wafer is thus covered with the carbon protection film 6 over the entire surface thereof, no step bunching is created on the surface of the silicon carbide wafer. Measurement of asperity on the surface of the silicon carbide wafer by atomic force microscopy (AFM) after removal of the carbon protection film 6 revealed that, whereas asperity to the extent of several dozens nanometers was created over the entire surface of a silicon carbide wafer in a case without the carbon protection film 6, asperity less than one nanometer was created in the case with the carbon protection film 6 according to the invention, whereby the effect of the film was verified. Moreover, since the carbon protection film 6 that is of high purity with few contaminants is formed, the silicon carbide semiconductor device does not become contaminated. Furthermore, since the carbon protection film 6 is formed over the entire surface of the silicon carbide wafer, unbalanced thermal stress created therein during the annealing treatment is relieved, so that distortion created in the silicon carbide wafer is reduced. For that reason, crystal defects created in the silicon carbide wafer do not increase.

Figure 4:
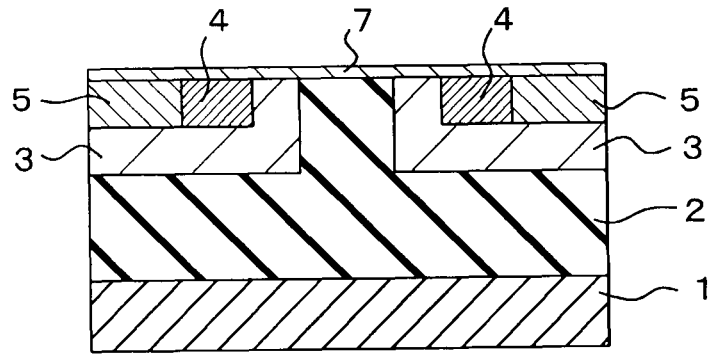
FIG. 4 is an illustration of one process in the method of manufacturing the silicon carbide semiconductor device, according to Embodiments 1 through 4 of the invention.

Next, a gate oxide film 7 made of silicon dioxide ($SiO_2$) is formed on one surface of, specifically, on the ion-implanted side of the silicon carbide wafer from which the carbon protection film 6 has been removed by thermal oxidation, as shown in FIG. 4. The gate oxide film 7 thus formed in this process is a thermal oxidation film.

Figure 5:
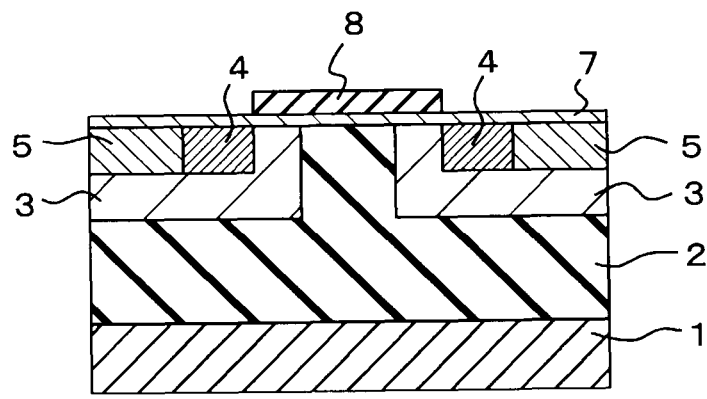
FIG. 5 is an illustration of one process in the method of manufacturing the silicon carbide semiconductor device, according to Embodiments 1 through 4 of the invention.

Next, a polysilicon film is temporarily formed on the gate oxide film 7 by a CVD method. Then, a gate electrode 8 is formed, after an unnecessary portion of the polysilicon film is removed by a wet etching method or a dry etching method such as a reactive ion etching (RIE) using a resist as a mask for the gate electrode, as shown in FIG. 5.

Figure 6:
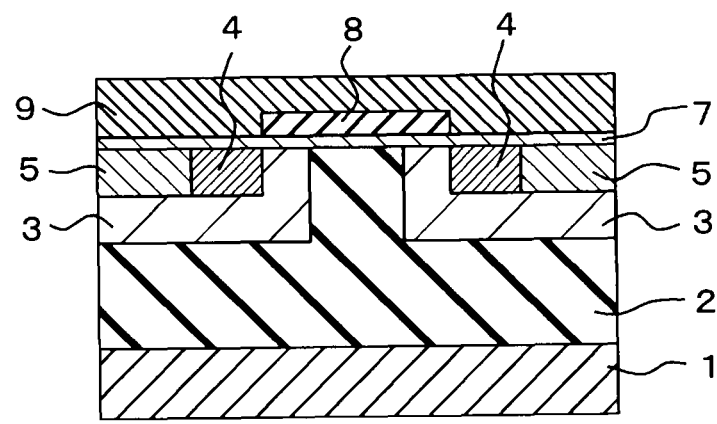
FIG. 6 is an illustration of one process in the method of manufacturing the silicon carbide semiconductor device, according to Embodiments 1 through 4 of the invention.

Next, an interlayer insulation film 9 made of silicon dioxide ($SiO_2$) is formed on the gate oxide film 7 and the gate electrode 8 by a CVD method using tetraethoxysilane (TEOS) gas, as shown in FIG. 6. The interlayer insulation film 9 formed in this process is a TEOS oxide film.

Figure 7:
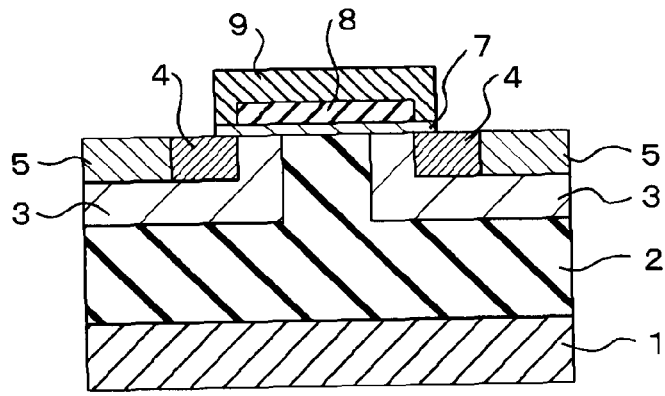
FIG. 7 is an illustration of one process in the method of manufacturing the silicon carbide semiconductor device, according to Embodiments 1 through 4 of the invention.

Next, the interlayer insulation film 9 and the gate oxide film 7 are removed by a wet etching method or a dry etching method such as a RIE using a resist as a mask for exposing the contact region 5 and part of the source region 4, as shown in FIG. 7. After that, the resist is also removed.

Figure 8:
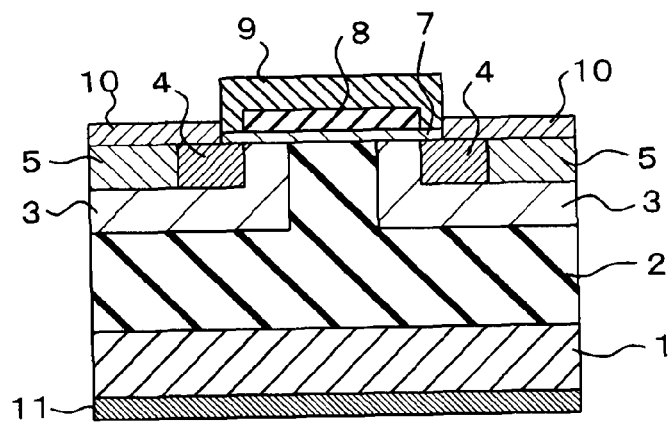
FIG. 8 is an illustration of one process in the method of manufacturing the silicon carbide semiconductor device, according to Embodiments 1 through 4 of the invention.

Next, a conductive film is formed on the contact region 5 and the part of the source region 4 that have been exposed by removing the interlayer insulation film 9 and the gate oxide film 7, by a physical vapor deposition method (PVD Method) such as a sputtering method. After that, a source electrode 10 (a first main electrode) is formed on the contact region 5 and the part of the source region 4 by removing an unnecessary portion of the conductive film having been formed on the interlayer insulation film 9 by a wet etching method or a dry etching method such as a RIE using a resist as a mask for the source electrode, as shown in FIG. 8. The source electrode 10 is electrically connected with the contact region 5 and the source region 4. Nickel (Ni) or aluminum (Al) is given as a material for the source electrode 10.

Lastly, a drain electrode 11 (a second main electrode) made of a conductive film is formed on the silicon carbide wafer surface opposite to the source electrode by a PVD method such as a sputtering method, as shown in FIG. 8. Nickel (Ni) or aluminum (Al) is given as a material for the drain electrode 11.

Through the processes described above, the main part of the MOSFET is completed that is the silicon carbide semiconductor device according to Embodiment 1 of the invention.

A method of manufacturing a silicon carbide semiconductor device, according to Embodiment 1 of the invention includes a process of forming a carbon protection film of a predetermined thickness over the entire surface of a silicon carbide wafer having been ion-implanted with an impurity by a CVD method that deposits a film by pyrolyzing a hydrocarbon gas. Since the carbon protection film 6 that is of high quality and high purity with few contaminants can thereby be obtained, the silicon carbide semiconductor device can be prevented from being contaminated. Moreover, since unbalanced thermal stress created in the silicon carbide wafer can be suppressed, crystal defects, associated with the thermal stress, in the silicon carbide wafer can also be prevented from increasing. Therefore, the method of manufacturing a silicon carbide semiconductor device can be obtained that achieves improvements in its quality stability and manufacturing yields.

Embodiment 2

In Embodiment 1, the carbon protection film 6 of high quality and high purity is formed over the entire surface of a silicon carbide wafer by pyrolyzing a hydrocarbon gas such as acetylene or methane at a temperature ranging from 900° C. to 1000° C. Moreover, it is assumed in Embodiment 1 that the pyrolysis of the hydrocarbon gas and the formation of the carbon protection film 6 are performed in a CVD deposition apparatus at the same time and in the same process. In contrast, Embodiment 2 is characterized in that a CVD deposition apparatus is constituted with a gas pyrolysis furnace and a deposition furnace on the upstream and the downstream sides, respectively, with respect to a hydrocarbon gas flow, to perform pyrolysis of the hydrocarbon gas and formation of a carbon protection film 6 in separate processes in the respective furnaces. Hereinafter, a method of forming the carbon protection film 6, according to Embodiment 2 will be explained with reference to the illustration of the deposition apparatus shown in FIG. 9. In Embodiment 2, processes other than that of forming the carbon protection film 6 by pyrolyzing the hydrocarbon gas are the same as those explained in Embodiment 1; their explanations are therefore omitted.

Figure 9:
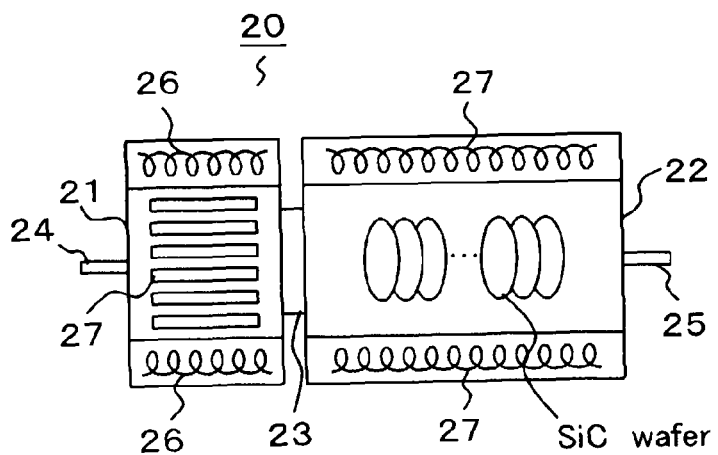
FIG. 9 is a schematic view illustrating a deposition apparatus according to Embodiments 2 of the invention.

A deposition apparatus 20 for forming the carbon protection film 6 is illustrated in FIG. 9. The deposition apparatus 20 is provided with a gas pyrolysis furnace 21 for pyrolyzing a hydrocarbon gas such as acetylene and methane; a deposition furnace 22 for depositing the carbon protection film 6 over the entire surface of a silicon carbide wafer; a connection pipe 23 for introducing, from the gas pyrolysis furnace 21 into the deposition furnace 22, the gas having been pyrolyzed from the hydrocarbon gas; a gas inlet pipe 24 for introducing the hydrocarbon gas into the gas pyrolysis furnace 21; and an exhaust gas pipe 25 for exhausting the pyrolyzed hydrocarbon gas in the deposition furnace 22.

The gas pyrolysis furnace 21 is provided with a heater 26 and heat spreaders 27 for uniformly heating the inside of the gas pyrolysis furnace 21 by receiving heat from the heater 26. The heater 26 is disposed around the inner periphery of the gas pyrolysis furnace 21 so as not to be directly exposed to the hydrocarbon gas. The heat spreaders 27 are made of silica glass or ceramics and disposed in the gas pyrolysis furnace 21. The gas pyrolysis furnace 21 thus configured uniformly transfers the heat from the heater 26 to the hydrocarbon gas through the heat spreaders 27, enabling complete pyrolysis of the hydrocarbon gas.

The deposition furnace 22 is provided with a heater 27 disposed around the inner periphery thereof so as not to be directly exposed to the pyrolyzed hydrocarbon gas and a wafer boat, not shown in the figure, on which silicon carbide wafers are placed for batch operation so that the carbon protection film 6 can be formed over the entire surface of each silicon carbide wafer.

The carbon protection film 6 is formed in the following way by such deposition apparatus 20.

An inert gas such as argon (Ar) is introduced as a carrier gas into the inside of the deposition apparatus 20 through the gas inlet pipe 24. The pressure inside the deposition apparatus 20 is controlled by adjusting the rate of exhaust gas at the exhaust gas pipe 25 so as to be an atmospheric or a reduced pressure. The insides of the gas pyrolysis furnace 21 and the deposition furnace 22 are heated for about twenty minutes to a temperature of approximately 800° C. and to a temperature ranging from 500° C. to 800° C., respectively, under the atmospheric or the reduced pressure in the deposition apparatus 20. After that, a hydrocarbon gas such as acetylene or methane is introduced at a concentration of approximately 10% into the flowing carrier gas, to be pyrolyzed in the gas pyrolysis furnace 21. The hydrocarbon gas may be introduced to flow into the carrier gas from the beginning. The hydrocarbon gas is almost completely pyrolyzed due to the heat spreaders 27. The hydrocarbon gas having been pyrolyzed in the gas pyrolysis furnace 21 is then introduced into the deposition furnace 22 through the connection pipe 23. The pyrolyzed hydrocarbon gas introduced into the deposition furnace 22 is deposited over the entire surface of each silicon carbide wafer placed in the deposition furnace 22, so that the carbon protection film 6 that is of high quality and high purity with few contaminants is formed to a predetermined thickness. The predetermined thickness is preferable to be from one nanometer, above which the effect of the protection film is brought about, to one thousand nanometers, under which cracks due to the thermal load imposing the silicon carbide wafer and to the temperature difference arising therein are not produced in the protection film. It is more preferable to be ten to five hundred nanometers, in which range the thickness is easy to control. In addition, the high quality implies an advanced state of graphitization. After the carbon protection film 6 is formed to the predetermined thickness, the gas inside the deposition apparatus 20 is immediately exhausted, and at the same time, the inside of the deposition apparatus 20 is cooled down to a temperature at which the silicon carbide wafer can be removed therefrom.

According to Embodiment 2, since a deposition apparatus is separated into the gas pyrolysis furnace 21 and the deposition furnace 22, and a process of pyrolyzing a hydrocarbon gas such as acetylene or methane is provided in advance before the carbon protection film 6 is formed, the carbon protection film 6 that has an effect equal to that of Embodiment 1 can be formed at a temperature lower than that therein. Therefore, a method of manufacturing a silicon carbide semiconductor device can be obtained that achieves improvements in its quality stability and manufacturing yields.

Moreover, if the inside the deposition furnace 22 is set at a temperature, for example, equal to that in Embodiment 1, the carbon protection film 6 can be obtained that is of higher quality, specifically, of more advanced graphitization compared to Embodiment 1. Therefore, a method of manufacturing a silicon carbide semiconductor device can be obtained that achieves further improvements in its quality stability and manufacturing yields.

Embodiment 3

While, in Embodiment 1 and Embodiment 2, the cases of using a hydrocarbon gas such as acetylene, methane, and propane has been explained as examples, a lower alcohol such as ethyl alcohol ($C_2H_5OH$: ethanol) and methyl alcohol ($CH_3OH$: methanol), which is one of oxygen-containing hydrocarbons, can also be used. Here, a method of manufacturing a silicon carbide semiconductor device using ethanol or methanol will be described for a case with a power MOSFET as an example. The method of manufacturing the power MOSFET, except for a process of forming a carbon protection film, is the same as that shown in FIGS. 1 through 8 in Embodiment 1; hence the description is made with reference to FIGS. 1 through 8.

Firstly, an n⁻-type (a first conductivity-type) silicon carbide layer 2, which is made of silicon carbide, is formed on one surface of an n⁺-type (a first conductivity-type) semiconductor substrate 1 by epitaxial crystal growth, as shown in FIG. 1. As the semiconductor substrate 1, for example, an n⁺-type silicon carbide substrate is preferable. A silicon carbide wafer is made up of the semiconductor substrate 1 and the silicon carbide layer 2.

Next, a p-type (a second conductivity-type) well region 3 is formed by ion-implanting an impurity into a surface of the silicon carbide wafer using a resist as a mask for the well region. To be more specific, the impurity is ion-implanted selectively into a portion outside a predetermined radius, on the surface of the silicon carbide layer 2 constituting the silicon carbide wafer, as shown in FIG. 2. As an impurity to become a p-type in the silicon carbide layer 2, for example, boron (B) or aluminum (Al) is given. The resist is removed after the ion implantation.

Next, an n-type (a first conductivity-type) source region 4 is formed by ion-implanting an impurity selectively into the surface of the well region 3 using a resist as a mask for the source region, as shown in FIG. 2. As an impurity to become an n-type in the well region 3, for example, phosphorus (P) or nitrogen (N) is given. After the ion implantation, the resist is removed.

Next, a p⁺-type (a second conductivity-type) contact region 5 is formed contiguous with the outer periphery of the source region 4 by ion-implanting a p-type (a second conductivity-type) impurity into the surface of the well region 3 using a resist as a mask for the contact region, as shown in FIG. 2. A concentration of the impurity in the contact region 5 is set here so as to be relatively higher than that in the well region 3. As an impurity to become a p-type in the well region 3, for example, boron (B) or aluminum (Al) is given. After the ion implantation, the resist is removed.

Next, a carbon protection film 6 is formed over the entire surface of the silicon carbide wafer by a CVD method or the like using an oxygen-containing hydrocarbon gas such as ethanol and methanol, as shown in FIG. 3.

To be more specific, while an inert gas such as argon (Ar) is being introduced as a carrier gas to flow into the deposition apparatus performing a CVD, the inside of the deposition apparatus is heated to a temperature ranging from 850° C. to 1000° C. under a reduced pressure below $1.33 \times 10^4$ Pa (100 Torr), preferably below $6.67 \times 10^3$ Pa (50 Torr), more preferably below $1.33 \times 10^3$ Pa (10 Torr). The heating time is approximately twenty minutes. After that, with the carrier gas being shut off or flowing, the oxygen-containing hydrocarbon gas is fed, and then the hydrocarbon gas is pyrolyzed under the reduced pressure mentioned above, whereby the carbon protection film 6 is formed to a predetermined thickness over the entire surface of the silicon carbide wafer. The predetermined thickness here is preferable to be from one nanometer, above which the effect of the protection film is brought about, to one thousand nanometers, under which cracks due to the thermal load imposing the silicon carbide wafer and to the temperature difference arising therein are not produced in the protection film. It is more preferable to be ten to five hundred nanometers, in which range the thickness is easy to control. Since a hydrocarbon gas of high purity can be thus used in a CVD method or the like, the carbon protection film 6 is formed to be of high quality and high purity with few contaminants. The high quality here implies an advanced state of graphitization. Moreover, since the carbon protection film 6 is formed over the entire surface of the silicon carbide wafer, the film formation can be performed in a batch operation. In other words, the film formation can be performed for a plurality of silicon carbide wafers all together by placing them within a deposition apparatus at intervals such that the carbon protection film 6 can be uniformly formed over the entire surface of each silicon carbide wafer, therefore improving throughput of the film formation.

Figure 10:
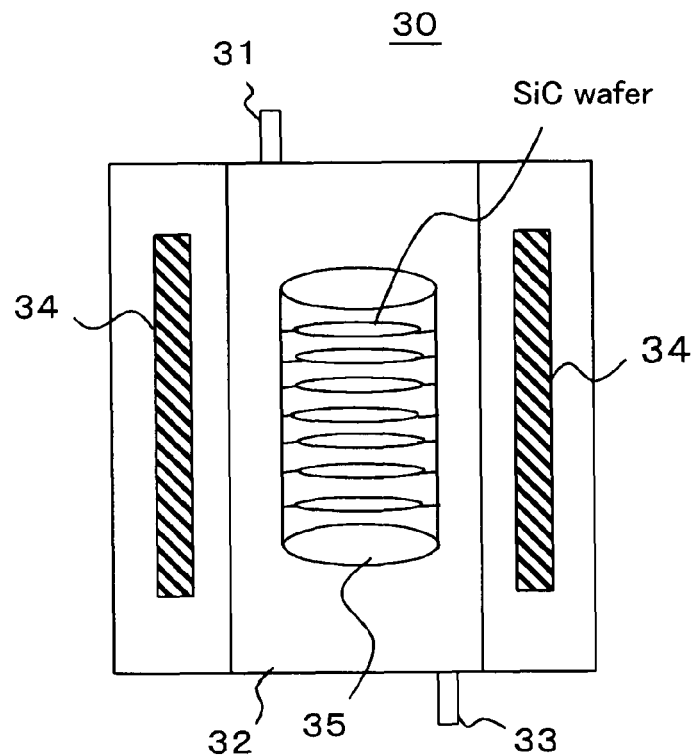
FIG. 10 is a schematic view illustrating a deposition apparatus according to Embodiment 3 of the invention.

Here, a deposition apparatus suitable to form the carbon protection film 6 is illustrated in FIG. 10 as an example in Embodiment 3.

Referring to FIG. 10, a deposition apparatus 30 is for forming the carbon protection film 6. The deposition apparatus 30 is provided with a gas inlet pipe 31 for introducing an oxygen-containing hydrocarbon gas such as ethanol and methanol into the deposition apparatus; a deposition furnace 32 for forming the carbon protection film 6 over the entire surface of a silicon carbide wafer; an exhaust gas pipe 33 for exhausting the pyrolyzed hydrocarbon gas; a heater 34 disposed around the periphery of the deposition furnace 32 so as not to be directly exposed to the hydrocarbon gas, for pyrolyzing the hydrocarbon gas; and a substrate holder 35 for holding silicon carbide wafers in such a way that the carbon protection film 6 can be formed over the entire surface of each wafer in a batch operation. It is conceivable that the substrate holder 35 holds the silicon carbide wafers by supporting their peripheries, for example, at three points of each periphery. In addition, the substrate holder 35 has a function equal to that of the wafer boat for silicon carbide wafers being placed thereon, which is mentioned in Embodiment 1 and Embodiment 2.

Formation of the carbon protection film 6 by the deposition apparatus 30 is as follows.

An inert gas such as argon (Ar) is introduced as a carrier gas into the inside of the deposition furnace 32 through the gas inlet pipe 31. The pressure inside the deposition furnace 32 is controlled by adjusting the rate of exhaust gas at the exhaust gas pipe 33 so as to be in a reduced pressure state (below $1.33 \times 10^4$ Pa (100 Torr), preferably below $6.67 \times 10^3$ Pa (50 Torr), more preferably below $1.33 \times 10^3$ Pa (10 Torr)). The inside of the deposition furnace 32 is heated by the heater 34 for about thirty minutes to a temperature ranging from 800° C. to 1000° C. under the condition of the above-mentioned reduced pressure. At the time when the inside of the deposition furnace 32 reaches a predetermined temperature, the carrier gas flow is shut off. Then, the oxygen-containing hydrocarbon gas such as ethanol and methanol is introduced through the gas inlet pipe 31 into the deposition furnace 32, and the inside thereof is adjusted to a predetermined pressure, for example, to the above-mentioned reduced pressure. The oxygen-containing hydrocarbon gas introduced into the deposition furnace 32 is pyrolyzed thereinside, so that the carbon protection film 6 that is of high quality and high purity with few contaminants is formed to the predetermined thickness over the entire surface of each of a plurality of such silicon carbide wafers placed on the substrate holder 35. The predetermined thickness here, as mentioned before, is preferable to be from one nanometer, above which the effect of the protection film is brought about, to one thousand nanometers, under which cracks due to the thermal load imposing the silicon carbide wafer and to the temperature difference arising therein are not produced in the protection film. It is more preferable to be ten to five hundred nanometers, in which range the thickness is easy to control. In addition, the high quality implies an advanced state of graphitization. After the carbon protection film 6 of the predetermined thickness is formed, the gas inside the deposition apparatus 32 is immediately exhausted, and at the same time, the carrier gas is introduced again and the inside thereof is cooled down to a temperature at which the silicon carbide wafers can be removed therefrom. In this way, the carbon protection film 6 of high quality and high purity with few contaminants is formed to the predetermined thickness over the entire surface of each silicon carbide wafer. In addition, the configuration of the deposition apparatus 30 shown in FIG. 10 can also be applied to formation of the carbon protection film 6 shown in Embodiment 1. It is noted that the configuration of the deposition apparatus 30 shown in FIG. 10 is just an example; hence, no specific limitation is imposed to the configuration. A deposition apparatus may be provided with a configuration equivalent to that of the deposition apparatus 30 shown in FIG. 10.

Next, the silicon carbide wafer having been deposited with the carbon protection film 6 over the entire surface thereof is placed into an annealing apparatus, to be annealed in an inert gas atmosphere.

To be more specific, in an argon atmosphere, the wafer, after being pre-heated at approximately 1000° C., is heated for a predetermined time (approximately 30 minutes) at a predetermined temperature (above 1500° C., preferably around 1700° C.), and then cooled immediately. Thereby, the implanted ion is electrically activated, and crystal defects created by the ion implantation are removed.

After the annealing treatment, the carbon protection film 6 is removed by being exposed to an oxygen atmosphere at approximately 950° C. for about thirty minutes. Otherwise, the carbon protection film 6 can also be removed by ashing using oxygen plasma that is employed for resist removal.

During the annealing treatment, since the silicon carbide wafer is thus covered with the carbon protection film 6 deposited over the entire surface thereof, no step bunching is created on the silicon carbide wafer surface. Measurement of asperity on the surface of the silicon carbide wafer by atomic force microscopy (AFM) after removal of the carbon protection film 6 revealed that, whereas asperity to the extent of several dozens nanometers was created over the entire surface of the silicon carbide wafer in a case without the carbon protection film 6, asperity less than one nanometer was created in the case with the carbon protection film 6 according to the invention, whereby the effect of the film was verified. Moreover, since the carbon protection film 6 that is of high purity with few contaminants is formed, the silicon carbide semiconductor device does not become contaminated. Furthermore, since the carbon protection film 6 is formed over the entire surface of the silicon carbide wafer, unbalanced thermal stress created therein during the annealing treatment is relieved, so that distortion created in the silicon carbide wafer is reduced. For that reason, crystal defects created in the silicon carbide wafer do not increase.

Next, a gate oxide film 7 made of silicon dioxide ($SiO_2$) is formed on one surface of, specifically, on an ion-implanted side of the silicon carbide wafer from which side the carbon protection film 6 has been removed by thermal oxidation as shown in FIG. 4. The gate oxide film 7 thus formed in this process is a thermal oxidation film.

Next, a polysilicon film is temporarily formed on the gate oxide film 7 by a CVD method. Then, a gate electrode 8 is formed, after an unnecessary portion of the polysilicon film is removed by a wet etching method or a dry etching method such as a reactive ion etching (RIE) using a resist as a mask for the gate electrode, as shown in FIG. 5.

Next, an interlayer insulation film 9 made of silicon dioxide ($SiO_2$) is formed on the gate oxide film 7 and the gate electrode 8 by a CVD method using a TEOS gas, as shown in FIG. 6. The interlayer insulation film 9 formed in this process is a TEOS oxide film.

Next, the interlayer insulation film 9 and the gate oxide film 7 are removed by a wet etching method or a dry etching method such as a RIE using a resist as a mask for exposing the contact region 5 and part of the source region 4, as shown in FIG. 7. After that, the resist is also removed.

Next, a conductive film is formed on the contact region 5 and the part of the source region 4 that have been exposed by removing the interlayer insulation film 9 and the gate oxide film 7, by a PVD method such as a sputtering method. After that, a source electrode 10 (a first main electrode) is formed on the contact region 5 and the part of the source region 4 by removing an unnecessary portion of the conductive film formed on the interlayer insulation film 9 by a wet etching method or a dry etching method such as RIE using a resist as a mask for the source electrode, as shown in FIG. 8. The source electrode 10 is electrically connected with the contact region 5 and the source region 4. Nickel (Ni) or aluminum (Al) is given as a material for the source electrode 10.

Lastly, a drain electrode 11 (a second main electrode) made of a conductive film is formed on the silicon carbide wafer surface opposite to the source electrode by a PVD method such as a sputtering method, as shown in FIG. 8. Nickel (Ni) or aluminum (Al) is given as a material for the drain electrode 11.

Through the processes described above, the main part of the power MOSFET is completed that is the silicon carbide semiconductor device according to Embodiment 3 of the invention.

A method of manufacturing a silicon carbide semiconductor device, according to Embodiment 3 of the invention includes a process of forming a carbon protection film of a predetermined thickness over the entire surface of a silicon carbide wafer having been ion-implanted with an impurity, by a CVD method that deposits a film by pyrolyzing an oxygen-containing hydrocarbon gas. Since the carbon protection film 6 that is of high quality and high purity with few contaminants can thereby be obtained, the silicon carbide semiconductor device can be prevented from being contaminated. Moreover, since unbalanced thermal stress created in the silicon carbide wafer can be suppressed, crystal defects, associated with the thermal stress, in the silicon carbide wafer can also be prevented from increasing. Therefore, the method of manufacturing a silicon carbide semiconductor device can be obtained that achieves improvements in its quality stability and manufacturing yields.

Moreover, the carbon protection film deposited from an oxygen-containing hydrocarbon gas has fewer defects than that deposited from a general hydrocarbon gas containing no oxygen.

This is due to the fact that activated oxygen produced during the pyrolysis of the oxygen-containing hydrocarbon gas at a high temperature reacts with the depositing amorphous carbon to produce carbon monoxide, which contributes to reducing defects in the carbon protection film.

Moreover, using an oxygen-containing hydrocarbon gas for forming a carbon protection film decreases production of unreacted hydrocarbon during formation of the carbon protection film by a CVD, which reduces adhesion of the unreacted carbon and higher hydrocarbon film to the inside of the deposition apparatus. Therefore, an effect is also brought about that improves maintainability of the deposition apparatus.

Although the case of using a lower alcohol such as ethanol and methanol as an oxygen-containing hydrocarbon gas is explained as an example in Embodiment 3, a gas consisting of oxygen, carbon, and hydrogen can be used as an oxygen-containing hydrocarbon gas: for example, a higher alcohol such as cetanol, a hydroxyl acid, a carboxylic acid, a ketone, an aldehyde, a phenol, an ester, or an ether may also be used by evaporating it. For such case, a manufacturing method equivalent to that of Embodiment 3 is employable and can bring about the same effect. It is noted that, in practical use, a higher oxygen-containing hydrocarbon is rather undesirable; a lower one containing ten or less carbons in a molecule is desirable, and additionally a lower one having a higher vapor pressure is more desirable. From that point of view, it can be said that a lower alcohol such as ethyl alcohol and methyl alcohol is desirable.

Embodiment 4

While the explanation is made in Embodiment 3 on formation of the carbon protection film 6 using an oxygen-containing hydrocarbon gas such as ethanol and methanol, in a case of using a cyclic ether compound such as tetrahydrofuran (THF) as an oxygen-containing hydrocarbon gas, a carbon protection film 6 is formed under slightly different conditions. A process different from that in the method of manufacturing the silicon carbide semiconductor device in Embodiment 3, that is, formation of the carbon protection film 6 using tetrahydrofuran will be explained below with reference to FIGS. 1 through 8 and FIG. 10. The other processes in the method of manufacturing the silicon carbide semiconductor device are the same as those explained in Embodiment 3; their explanations are therefore omitted.

After a silicon carbide wafer has been processed up to the stage shown in FIG. 2 in Embodiment 3, the carbon protection film 6 is formed over the entire surface of the silicon carbide wafer using tetrahydrofuran as an oxygen-containing hydrocarbon gas by a CVD method or the like, as shown in FIG. 3.

To be more specific, while an inert gas such as argon (Ar) is being introduced as a carrier gas to flow into the deposition furnace 32 performing a CVD, the inside of the deposition apparatus is heated at a temperature ranging from 850° C. to 1000° C. using the heater 34 under reduced pressure. The heating time is approximately twenty minutes. After that, a pressurized tetrahydrofuran is fed gradually into an evaporator from a feeder, which are not shown, to be evaporated in the evaporator at 120° C., and then introduced into the deposition furnace 32 through the gas inlet pipe 31. In order to prevent condensation, the pipes from the evaporator to the deposition furnace 32, including the gas inlet pipe 31, are heated above 100° C. by heaters, which are not shown, provided around the pipes. Tetrahydrofuran needs to be pyrolyzed and deposited under a pressure below $1.33 \times 10^4$ Pa (100 Torr) in the deposition furnace 32. More desirably, the pressure therein is set to $7 \times 10^3$ Pa (52.5 Torr), which enhances the deposition rate. In this way, the oxygen-containing hydrocarbon gas introduced into the deposition furnace 32 is pyrolyzed therein, to form the carbon protection films 6 that is of high quality and high purity with few contaminants to a predetermined thickness over the entire surface of each of a plurality of silicon carbide wafers placed on the substrate holder 35. The predetermined thickness here, as mentioned before, is preferable to be one nanometer, above which the effect of the protection film is brought about, to one thousand nanometers, under which cracks due to the thermal load imposing the silicon carbide wafer and to the temperature difference arising therein are not produced in the protection film. It is more preferable to be ten to five hundred nanometers, in which range the thickness is easy to control. In addition, the high quality implies an advanced state of graphitization. After the carbon protection film 6 of the predetermined thickness is formed, the feed of the tetrahydrofuran from the feeder is stopped, and the inside the deposition furnace 32 is cooled down to a temperature at which the silicon carbide wafers can be removed therefrom.

Thereby, the carbon protection film 6 can be formed that brings about the same effect as that of Embodiment 3. Processes subsequent to that are the same as the annealing treatment and those subsequent thereto in Embodiment 3.

Embodiment 5

According to Embodiment 1 through Embodiment 4, after the carbon protection film 6 has been formed over the entire surface of each of silicon carbide wafers in the deposition apparatus, the silicon carbide wafers are transferred into the annealing apparatus. For that reason, the carbon protection film 6 formed on the silicon carbide wafer surfaces may be subject to peel or partial damage due to rubbing during the transfer, which gives cause for concern that the silicon carbide semiconductor device decreases in its quality and manufacturing yields.

A method of preventing such damages is to share a substrate holder 35 between the deposition apparatus that deposits the carbon protection film 6 over the entire surface of the silicon carbide wafers and the annealing apparatus that anneals the silicon carbide wafers having been deposited with the carbon protection film 6 thereon.

In other words, the substrate holder 35 that enables the carbon protection film 6 to be deposited over the entire surface of each of the plurality of silicon carbide wafers and enables the wafers to be placed on the holder for a batch operation, is provided usable in both deposition and annealing apparatuses shown in Embodiment 1 through Embodiment 4.

Figure 11:
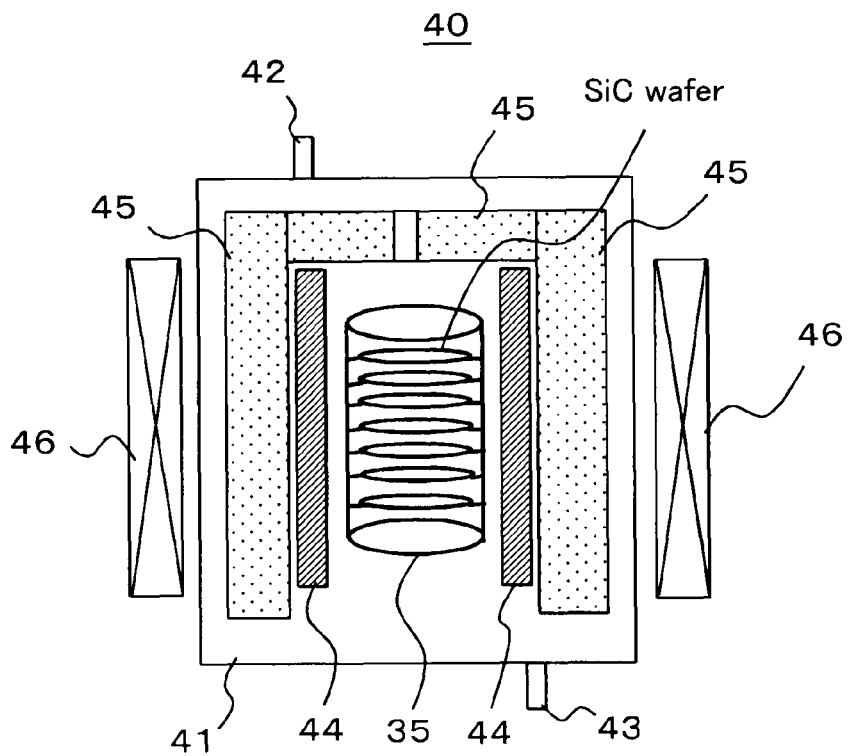
FIG. 11 is a schematic view illustrating an annealing apparatus according to Embodiment 5 of the invention.

FIG. 11 shows an example of a typical annealing apparatus. In FIG. 11, an annealing apparatus 40 is provided with an annealing furnace 41; a gas inlet pipe 42 for introducing an inert gas such as argon into the annealing furnace 41; and an exhaust gas pipe 43 for exhausting gases within the annealing furnace 41 therethrough; the substrate holder 35 on which the plurality of silicon carbide wafers can be placed and is usable also for the deposition apparatus; a heater 44 such as a carbon heater, disposed so as to surround the substrate holder 35; heat spreaders 45, which are made of silica, ceramics, or the like, disposed at least around the heater 44, for uniformly transferring heat from the heater 44 to the silicon carbide wafers; and a coil 46 disposed around the periphery of the annealing furnace 41, for heating the heater 44 by induction.

Using the annealing apparatus 40 thus configured, after exhaust of gases within the annealing furnace 41, argon gas is introduced though the gas inlet pipe 42. Then, heat from the heater 44 induction-heated by the coil 46 is uniformly spread by the heat spreaders 45, so that the silicon carbide wafers placed on the substrate holder 35 are isothermally heated in the argon atmosphere set at a predetermined pressure, whereby a desired annealing treatment is performed. In addition, the substrate holder 35 used in the annealing treatment has been used in the deposition apparatus.

In this way, by using the substrate holder 35 in common between the deposition and the annealing processes, silicon carbide wafers placed on the substrate holder 35 can be transferred from the deposition apparatus to the annealing apparatus without changing the substrate holder. Therefore, the carbon protection film 6 formed on each silicon carbide wafer surface is not subject to peel or partial damage due to rubbing during the transfer, achieving further improvements in quality stability and manufacturing yields of the silicon carbide semiconductor device. Moreover, since the insides of the deposition and the annealing apparatuses become less contaminated, production efficiency can also be enhanced.

It is noted that, in each embodiment, the silicon carbide wafer is supported by the substrate holder during deposition of the carbon protection film 6. For that reason, the carbon protection film 6 is not formed or is difficult to form on portions where the substrate holder touches, of the silicon carbide wafer. However, such contact portions are smaller area with respect to the whole area of the silicon carbide wafer, which does not affect the effect of the invention at all. Therefore, "the silicon carbide wafer that is formed with the carbon protection film 6 over the entire surface thereof", referred to in the invention, also includes a silicon carbide wafer having portions, where the substrate holder touched, on which the carbon protection film 6 is not formed or is formed in a thinner film due to difficulty in depositing.

What is claimed is:

1. A method of manufacturing a silicon carbide semiconductor device, comprising:
   ion-implanting an impurity in a surface of a silicon carbide wafer;
   forming a carbon protection film of a predetermined thickness over all surfaces of the silicon carbide wafer, which has been ion-implanted with the impurity, by a chemical vapor deposition method that deposits a film by pyrolyzing a hydrocarbon gas; and
   annealing the silicon carbide wafer after the forming the carbon protection film.

2. The method of manufacturing a silicon carbide semiconductor device, as recited in claim 1, wherein the predetermined thickness is from one nanometer to one thousand nanometers.

3. The method of manufacturing a silicon carbide semiconductor device, as recited in claim 1, wherein the hydrocarbon gas is acetylene, methane, or propane.

4. The method of manufacturing a silicon carbide semiconductor device, as recited in claim 1, wherein the formation of the carbon protection film is performed for a plurality of such silicon carbide wafers all together in a batch operation.

5. The method of manufacturing a silicon carbide semiconductor device, as recited in claim 1, wherein a substrate holder is used in common in the forming the carbon protection film on the silicon carbide wafer and the annealing the silicon carbide wafer.

6. The method of manufacturing a silicon carbide semiconductor device, as recited in claim 1, wherein the formation of the carbon protection film is performed using a gas pyrolysis furnace for pyrolyzing the hydrocarbon gas and a deposition furnace for depositing the carbon protection film on the silicon carbide wafer by introducing the pyrolyzed hydrocarbon gas.

7. The method of manufacturing a silicon carbide semiconductor device, as recited in claim 6, wherein the predetermined thickness is from one nanometer to one thousand nanometers.

8. The method of manufacturing a silicon carbide semiconductor device, as recited in claim 6, wherein the hydrocarbon gas is acetylene, methane, or propane.

9. The method of manufacturing a silicon carbide semiconductor device, as recited in claim 6, wherein the formation of the carbon protection film is performed for a plurality of such silicon carbide wafers all together in a batch operation.

10. A method of manufacturing a silicon carbide semiconductor device, comprising:
   ion-implanting an impurity in a surface of a silicon carbide wafer;
   forming a carbon protection film of a predetermined thickness over all surfaces of the silicon carbide wafer, which has been ion-implanted with the impurity, by a chemical vapor deposition method that deposits a film by pyrolyzing an oxygen-containing hydrocarbon gas; and
   annealing the silicon carbide wafer after the forming the carbon protection film.

11. The method of manufacturing a silicon carbide semiconductor device, as recited in claim 10, wherein the predetermined thickness is from one nanometer to one thousand nanometers.

12. The method of manufacturing a silicon carbide semiconductor device, as recited in claim 10, wherein the oxygen-containing hydrocarbon gas is methyl alcohol, ethyl alcohol, cetanol, hydroxyl acid, carboxylic acid, keton, aldehyde, phenol, ester, ether, or tetrahydrofuran.

13. The method of manufacturing a silicon carbide semiconductor device, as recited in claim 10, wherein the formation of the carbon protection film is performed for a plurality of such silicon carbide wafers all together in a batch operation.

14. The method of manufacturing a silicon carbide semiconductor device, as recited in claim 10, wherein a substrate holder is used in common in the forming the carbon protection film on the silicon carbide wafer and the annealing the silicon carbide wafer.

15. The method of manufacturing a silicon carbide semiconductor device, as recited in claim 10, wherein the formation of the carbon protection film is performed under a reduced pressure of $1.33 \times 10^4$ Pa or below.

16. The method of manufacturing a silicon carbide semiconductor device, as recited in claim 15, wherein the predetermined thickness is from one nanometer to one thousand nanometers.

17. The method of manufacturing a silicon carbide semiconductor device, as recited in claim 15, wherein the oxygen-containing hydrocarbon gas is methyl alcohol, ethyl alcohol, cetanol, hydroxyl acid, carboxylic acid, keton, aldehyde, phenol, ester, ether, or tetrahydrofuran.

18. The method of manufacturing a silicon carbide semiconductor device, as recited in claim 15, wherein the formation of the carbon protection film is performed for a plurality of such silicon carbide wafers all together in a batch operation.

19. A method, comprising:
   ion-implanting an impurity in a first surface of a silicon carbide wafer to form a well region;
   forming a carbon protection film over the first surface and a second surface of the silicon carbide wafer, after the ion-implanting, by a chemical vapor deposition method that deposits a film by pyrolyzing a hydrocarbon gas, the second surface opposing the first surface across the well region; and
   annealing the silicon carbide wafer after the forming the carbon protection film.

* * * * *